US008729536B2

(12) United States Patent
Sakuma et al.

(10) Patent No.: US 8,729,536 B2
(45) Date of Patent: May 20, 2014

(54) ORGANIC LUMINESCENT MATERIALS, COATING SOLUTION USING SAME FOR ORGANIC EMITTING LAYER, ORGANIC LIGHT EMITTING DEVICE USING COATING SOLUTION AND LIGHT SOURCE DEVICE USING ORGANIC LIGHT EMITTING DEVICE

(71) Applicants: Hirotaka Sakuma, Hitachinaka (JP); Sukekazu Aratani, Hitachiota (JP); Hiroshi Sasaki, Mito (JP)

(72) Inventors: Hirotaka Sakuma, Hitachinaka (JP); Sukekazu Aratani, Hitachiota (JP); Hiroshi Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/659,947

(22) Filed: Oct. 25, 2012

(65) Prior Publication Data

US 2013/0048974 A1 Feb. 28, 2013

Related U.S. Application Data

(63) Continuation of application No. 12/858,470, filed on Aug. 18, 2010, now Pat. No. 8,319,211.

(30) Foreign Application Priority Data

Jan. 20, 2010 (JP) ................. 2010-009610
Jan. 20, 2010 (JP) ................. 2010-009611

(51) Int. Cl.
*H01L 51/54* (2006.01)

(52) U.S. Cl.
USPC ....... 257/40; 257/102; 257/103; 257/E51.041

(58) Field of Classification Search
USPC .............. 257/40, 102, 103, E51.041
See application file for complete search history.

(56) References Cited

U.S. PATENT DOCUMENTS

| 2005/0046337 A1 | 3/2005 | Chin |
| 2009/0200918 A1 | 8/2009 | Seo et al. |
| 2010/0127246 A1 | 5/2010 | Nakayama |

FOREIGN PATENT DOCUMENTS

| CN | 101510586 A | 8/2009 |
| JP | 09-063770 | 3/1997 |
| JP | 2013-509727 A | 3/2013 |
| JP | 2013-509728 A | 3/2013 |
| WO | WO 2008/132965 | 11/2008 |
| WO | WO 2009/119591 A1 | 10/2009 |
| WO | WO 2010/090925 | 8/2010 |
| WO | WO 2011/059816 A2 | 5/2011 |
| WO | WO 2011/059825 A2 | 5/2011 |

OTHER PUBLICATIONS

Song et al., White Organic Light-Emitting Devices Employing Phosphorescent Iridium Complex as RGB Dopants, Semiconductor Science Technology, vol. 22, No. 7, May 31, 2007, pp. 728-731.

(Continued)

*Primary Examiner* — Long Pham
(74) *Attorney, Agent, or Firm* — Antonelli, Terry, Stout & Kraus, LLP.

(57) ABSTRACT

It is an object of the present invention to provide an organic light-emitting device which can emit white light by easily controlling dopant concentrations. The organic light-emitting device has a first electrode (112) and second electrode (111) which hold a light-emitting layer (113) in-between, wherein the light-emitting layer contains a host material (104), red-light-emitting dopant (105), green-light-emitting dopant (106) and blue-light-emitting dopant (107), the red-light-emitting dopant containing a first functional group for transferring the dopant toward the first electrode and the green-light-emitting dopant containing a second functional group for transferring the dopant toward the second electrode.

27 Claims, 3 Drawing Sheets

(56) References Cited

OTHER PUBLICATIONS

Xie et al., High-Efficiency Electrophosphorescent White Organic Light-Emitting Devices with a Double-Doped Emissive Layer, Semiconductor Science Technology, vol. 20, No. 3, Feb. 17, 2005, pp. 326-329.

EP Search Report Appln. No. 10008532 dated Dec. 9, 2010 in English.
Japanese Office Action of Appln. No. 2010-009611 dated Feb. 7, 2012.
Chinese office action 201010255806.7 dated Apr. 17, 2013 with English translation.
JP Office Action of Appln. No. 2013-028548 dated Jan. 7, 2014.

ORGANIC LUMINESCENT MATERIALS, COATING SOLUTION USING SAME FOR ORGANIC EMITTING LAYER, ORGANIC LIGHT EMITTING DEVICE USING COATING SOLUTION AND LIGHT SOURCE DEVICE USING ORGANIC LIGHT EMITTING DEVICE

CROSS-REFERENCE TO RELATED APPLICATION

This application is a continuation application of U.S. application Ser. No. 12/858,470, filed Aug. 18, 2010, the contents of which are incorporated herein by reference.

FIELD OF THE INVENTION

The present invention relates to an organic luminescent material, coating solution using the organic luminescent material for organic light-emitting layers, organic light-emitting device using the coating solution and light source device using the organic light-emitting device.

BACKGROUND OF THE INVENTION

The methods for producing organic light-emitting devices (LEDs) broadly fall into two categories, vacuum vapor deposition and coating. The coating method has advantages of easily producing large-area films and high material utilization factor. In order to apply the coating method, development of devices with a single light-emitting layer is demanded, because it is necessary to reduce number of organic LED layers.

For organic white-light-emitting devices with a single light-emitting layer, Patent Document 1 discloses an organic EL device with a single light-emitting layer of a composition of at least (a) polymer and (b) compound for forming a light-emitting center, placed between electrodes. The composition contains an electron transfer material and hole transfer material in a well-balanced manner. The polymer itself emits blue or shorter wavelength colors, and is dispersed with at least two species of compounds for forming a light-emitting center, each individually emitting a color, where a combination of these compounds is selected in such a way that the organic EL device as a whole emits white color.

Recently, organic light-emitting devices have been attracting attention as planar light sources of the next generation. An organic light-emitting device exhibits excellent characteristics of spontaneously emitted light, wide view angle, high responsiveness and high color rendition. One example of organic light-emitting device comprises a glass substrate which supports a transparent electrode (e.g., of ITO), organic layer composed of hole transport layer, light-emitting layer, electron transport layer and so on, and repeller of low work function, where light is emitted from the back side of the substrate after passing through the electrode.

The methods for producing organic light-emitting devices include vacuum vapor deposition, ink jetting and printing. Vacuum vapor deposition heats and evaporates an organic material under a vacuum and deposits the vapor on a substrate to form the film thereon. It can simply produce an organic light-emitting device of desired structure because of its capability of controlling film thickness and concentration by manipulating deposition rate. However, it involves disadvantages of low material utilization factor and difficulty in increasing substrate size. Ink jetting or printing is expected to be a low-cost wet method, because of its advantages of high material utilization factor and easily forming large-area device, although involving a disadvantage of difficulty in forming laminated structures because solubility of an underlying material must be controlled for forming a laminated structure.

An organic light-emitting device must emit white color when used as a light source. It is necessary for the device to emit three colors of red, blue and green in order to realize white color of high rendition.

The wet methods proposed so far for producing organic white-light-emitting devices include mixing three species of dopants each emitting red, blue or green color in a light-emitting layer. For example, Patent Document 1 discloses a method which uses polyvinyl carbazole as a host material for light-emitting layer which is dispersed with red-, blue- and green-light-emitting dopants at a low concentration (0.01 to 5% by mol) to realize white color.

[Patent Document 1] JP-A-9-63770

BRIEF SUMMARY OF THE INVENTION

The conventional method for producing an organic light-emitting device involves a disadvantage of difficulty in emitting white color by easily controlling red-, green- and blue-light-emitting dopant concentrations without causing their phase separation.

The objects of the present invention are to provide an organic luminescent material capable of being controlled for dopant concentrations, coating solution using the organic luminescent material for organic light-emitting layers, organic light-emitting device using the coating solution and light source device using the organic light-emitting device.

The conventional coating method for producing an organic light-emitting device involves a disadvantage of difficulty in controlling dopant concentrations because of their very low concentrations, about 0.02% by mol with a green-light-emitting dopant, 0.02% and 0.015% by mol with a red-light-emitting dopant.

The other objects of the present invention are to provide an organic luminescent material easily emitting white light, coating solution using the organic luminescent material for organic light-emitting layers, organic light-emitting device using the coating solution and light source device using the organic light-emitting device.

One of the features of the present invention for solving the above problems is an organic light-emitting device with first and second electrodes which hold a light-emitting layer in-between, wherein the light-emitting layer contains a host material, red-light-emitting dopant and blue-light-emitting dopant, the red-light-emitting dopant containing a first functional group for transferring the dopant toward the first electrode.

Another feature of the present invention is a coating solution for producing the light-emitting device for the organic light-emitting device, the solution containing a solvent, host material, red-light-emitting dopant and blue-light-emitting dopant.

Still another feature of the present invention is an organic luminescent material for producing the light-emitting device for the organic light-emitting device, the material containing a host material, red-light-emitting dopant, blue-light-emitting dopant and green-light-emitting dopant.

Still another feature of the present invention is an organic light-emitting device with first and second electrodes which hold a light-emitting layer in-between, wherein the light-emitting layer contains a host material, red-light-emitting dopant and green-light-emitting dopant, the red-light-emitting dopant being present in the light-emitting layer at graded concentrations.

Still another feature of the present invention is a coating solution for producing the light-emitting device for the organic light-emitting device, the solution containing a solvent, host material, red-light-emitting dopant and green-light-emitting dopant.

Still another feature of the present invention is an organic luminescent material for producing the light-emitting device for the organic light-emitting device, the material containing a host material, red-light-emitting dopant, blue-light-emitting dopant and green-light-emitting dopant.

Still another feature of the present invention is a light source device using the organic light-emitting device including the organic light-emitting device.

Other objects, features and advantages of the invention will become apparent from the following description of the embodiments of the invention taken in conjunction with the accompanying drawings.

Advantages of the Invention

The present invention provides an organic luminescent material capable of emitting white light, produced by easily controlling dopant concentrations, coating solution using the organic luminescent material for organic light-emitting layers, organic light-emitting device using the coating solution and light source device using the organic light-emitting device. The other challenges, structures and advantages will be clarified by the description of the preferred embodiments described below.

The present invention also provides an organic luminescent material capable of easily emitting white light, coating solution using the organic luminescent material for organic light-emitting layers, organic light-emitting device using the coating solution and light source device using the organic light-emitting device.

DETAILED DESCRIPTION OF THE INVENTION

The present invention is described in detail by referring to the attached drawings and the like.

The conventional coating method for producing an organic light-emitting device involves a disadvantage of difficulty in controlling dopant concentrations because of their very low concentrations, about 0.02% by mol with a green-light-emitting dopant, 0.02% and 0.015% by mol with a red-light-emitting dopant. Moreover, the device cannot exhibit a sufficient light-emitting efficiency, because of insufficient energy transfer between the dopants and insufficient containment of the carrier in the light-emitting region.

Moreover, the conventional coating method for producing an organic light-emitting device involves disadvantages of insufficient light-emitting efficiency and difficulty in controlling dopant concentrations, resulting from transfer of energy between the dopants. Excitation energy of light-emitting dopant decreases in the descending order of blue-light-emitting, green-light-emitting and red-light-emitting dopants, by which is meat that energy transfer tends to occur from a blue-light-emitting dopant to a green-light-emitting dopant and from a green-light-emitting dopant to a red-light-emitting dopant. In a light-emitting structure with the three species of dopants, they are present close to each other, tending to cause energy transfer between the different species of dopants. A blue-light-emitting dopant will be transferred eventually to a red-light-emitting dopant of the lowest excitation energy when energy transfer can occur, depleting the blue-light-emitting dopant with the result that the device cannot efficiently emit while light. For the device to sufficiently emit blue light, it is necessary to greatly decrease green-light-emitting and red-light-emitting dopant concentrations.

The organic light-emitting layer as one embodiment of the present invention contains a host material and a dopant having a substituent which works to localize the dopant during the film-making step. The dopant is localized in the vicinity of the light-emitting layer surface or interface with the underlying layer. Being localized in the vicinity of the electrode means that the dopant is present in the layer at a higher concentration in the vicinity of the electrode. As a result, the light-emitting layer prepared by the wet method has a function substantially equivalent to that of a three-layered light-emitting layer. In such a structure, distance between the dissimilar dopants increases except in the vicinity of the interface, decelerating energy transfer between the dissimilar dopants, which facilitates control of dopant concentrations and formation of a white-light-emitting device.

Figure 1:
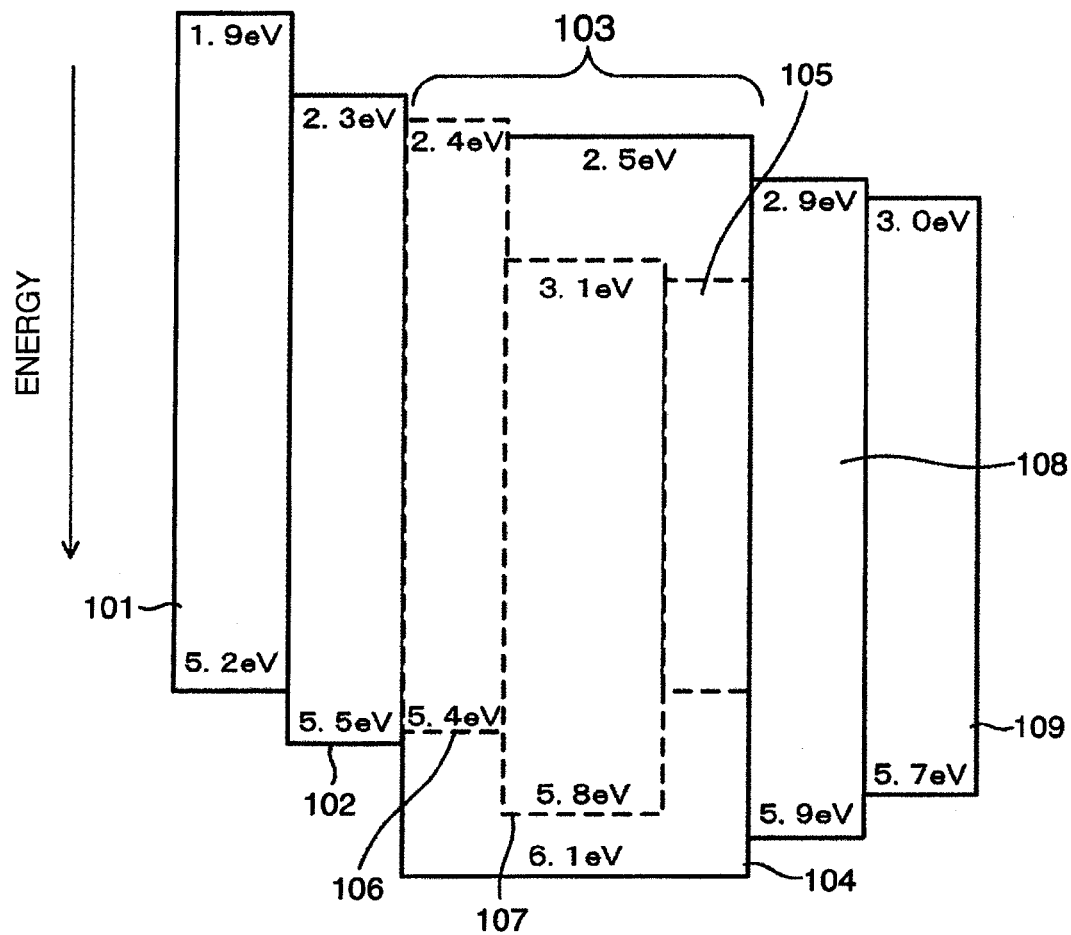
FIG. 1 is an energy diagram of each component in the white-light-emitting device.
Figure 2:
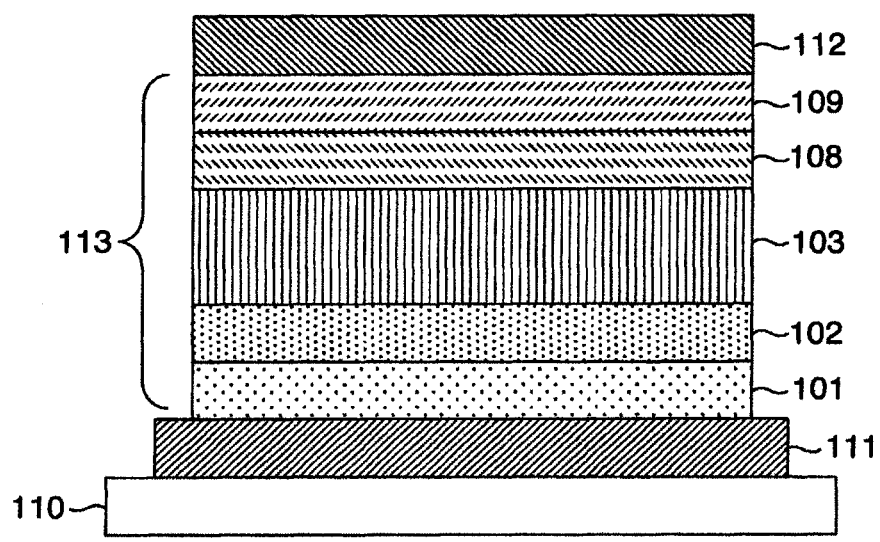
FIG. 2 is a cross-sectional view of one embodiment of the organic light-emitting device of the present invention.

FIG. 2 is a cross-sectional view of one embodiment of the organic white-light-emitting device of the present invention. The device has a substrate 110 which supports a lower electrode 111 as the second electrode, organic layer 113 and upper electrode 112 as the first electrode in this order from the substrate. The device is of bottom emission type in which light emitted by a light-emitting layer 103 is taken out from the lower electrode 111 side. The lower electrode 111 is the transparent electrode working as the anode and upper electrode 112 is the repeller working as the cathode. The organic layer 113 may be of a single-layer structure with the light-emitting layer 103 alone or multi-layer structure with one or more other layers selected from the group consisting of electron injection layer 109, electron transport layer 108, hole transport layer 102 and hole injection layer 101. The organic light-emitting layer illustrated in FIG. 1 makes a light source device, when provided with a driving circuit, case and so on.

The light-emitting layer contains a host molecule and dopant molecule which contains a red-light-emitting, green-light-emitting and blue-light-emitting dopants. A material for forming the light-emitting layer 103 contains a host molecule, and red-light-emitting, green-light-emitting and blue-light-emitting dopants. However, the material may not necessarily need a green-light-emitting dopant, if it can emit white light. Each of the dopants is localized in the light-emitting layer 103 to form a pseudo laminated structure. First, the light-emitting layer structure is described.

<Phase Separation>

When red-light-emitting, green-light-emitting and blue-light-emitting dopants are mixed with each other to form a single white-light-emitting layer, one species of the dopant is surrounded by one or two species of the dissimilar dopants, with the result that excitation energy is transferred from the dopant to the adjacent dissimilar dopant at a certain probability. For example, when the blue-light-emitting dopant is present adjacently to the green-light-emitting or red-lightemitting dopant, excitation energy is transferred from the blue-light-emitting dopant to the dopant of lower energy, green-light-emitting or red-light-emitting dopant, making it difficult for the single layer to emit white light. Even the coating method should produce a device efficiently emitting white light even when each of the dopants is present at a high concentration, if it could realize spontaneous phase-separation between the dissimilar dopants to separate dopants of lower energy from each other. The preset invention realizes the spontaneous phase-separation by incorporating each of the dopants with an adequate functional group.

<Host Material>

Examples of the preferable host material 104 include carbazole, fluorene and arylsilane derivatives. The host material preferably has an excitation energy sufficiently higher than that of the blue-light-emitting dopant to efficiently emit light, where excitation energy is determined by photoluminescence spectra.

<Red-Light-Emitting Dopant>

Examples of preferable materials for the red-light-emitting dopant 105 include those having a major skeleton of rubrene, (E)-2-(2-(4-dimethylamino)styryl)-6-methyl-4H-pyran-4-ylidene)malononitrile (DCM), its derivative, iridium complex (e.g., bis(1-phenylisoquinoline)(acetylacetonate) iridium (III)), osmium complex or europium complex, of which the iridium complex represented by Formula 1 is more preferable viewed from light-emitting characteristics, more preferably it has an acetylacetonate site, wherein X1 is an N-containing aromatic hetero ring, and X2 is an aromatic hydrocarbon ring or aromatic hetero ring.

[Formula 1]

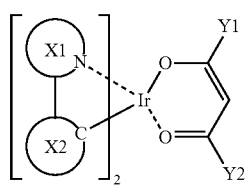

(Formula 1)

Examples of the aromatic hetero ring represented by X1 include quinoline, isoquinoline, pyridine, quinoxaline, thiazole, benzothiazole, oxazole, benzoxazole, indole and isoindole rings. Examples of the aromatic hydrocarbon ring or aromatic hetero ring represented by X2 include benzene, naphthalene, anthracene, thiophene, benzothiophene, furan, benzofuran and fluorene rings. When the upper electrode serves as the cathode and lower electrode as the anode, the red-light-emitting dopant, having a first functional group for transferring the dopant toward the first electrode, is preferably located in the upper portion of the light-emitting layer (surface side), which localizes the dopant on the upper electrode side. Examples of the first functional group Y1 or Y2 to be added to the acetylacetonate site to transfer the dopant toward the film surface side during the film-making step include fluoroalkyl, perfluoroalkyl, alkyl (of 10 carbon atoms or more), perfluoropolyether and siloxy (Si—O—Si—) groups. The red-light-emitting dopant 105 may contain one or more of these functional groups. The group may be introduced to the major skeleton directly, as illustrated by Formulae 2 and 3, or indirectly via an amido or ester bond, as illustrated by Formula 4.

[Formula 2]

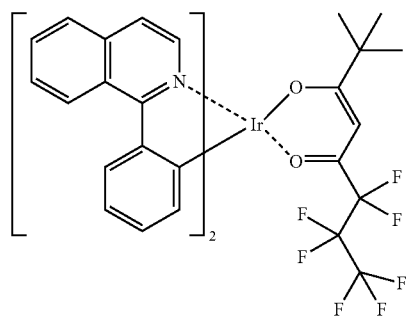

[Formula 3]

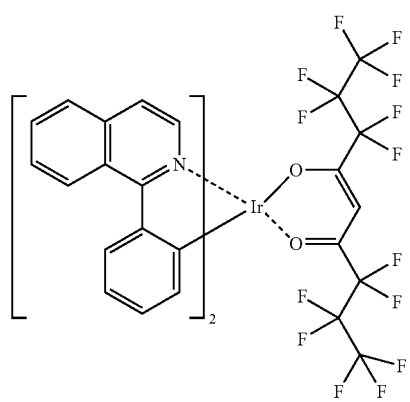

[Formula 4]

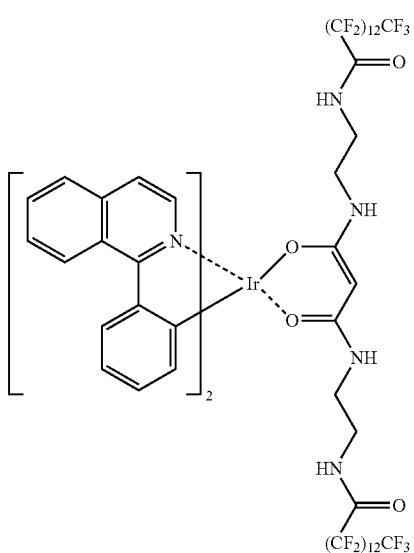

<Green-Light-Emitting Dopant>

Examples of preferable materials for the green-light-emitting dopant 106 include those having a major skeleton of coumarin, its derivative, iridium complex (e.g., tris(2-phenylpyridine) iridium, Ir (ppy)3). When the upper electrode serves as the cathode and lower electrode as the anode, the green-light-emitting dopant is preferably located in the lower portion of the light-emitting layer. The dopant contains a second functional group for transferring the dopant toward the lower electrode or hole transport layer. The second functional group varies depending on the underlying layer to which the dopant is transferred during the film-making step. When the underlying layer is the hole transport layer, the group should have a structure similar to the hole transport layer, e.g., phenylamino, oxazole or carbazole group, or hydrazone site. The green-light-emitting dopant 106 may contain one or more of these functional groups. When the underlying layer is the electrode of ITO or a metal, examples of the functional group include hydroxyl (—OH), thiol (—SH), carboxyl (—COOH), sulfo (—SO$_3$H) or bipyridyl group, or I, Br, Cl, F, SCN, CN, NH$_2$ or NO$_2$. The green-light-emitting dopant 106 may contain one or more of these functional groups. The group may be introduced to the major skeleton directly, as illustrated by Formula 5, or indirectly via an alkyl chain in consideration of the molecular size.

[Formula 5]

(Formula 5)

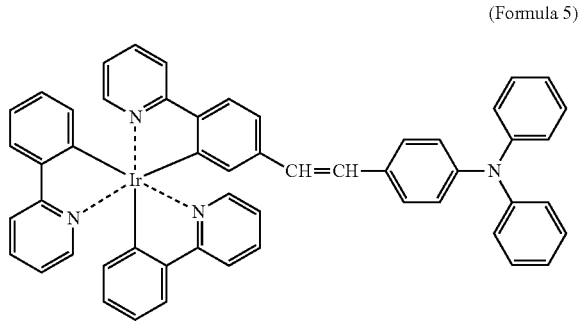

<Blue-Light-Emitting Dopant>

Examples of the major skeleton of the blue-light-emitting dopant 107 include perylene, iridium complex (e.g., bis(3,5-difluoro-2-(2-pyridyl)phenyl-(2-carboxypyridyl)iridium (III), FIrpic). The blue-light-emitting dopant may not necessarily need a functional group. However, a structure incompatible with the underlying layer may be introduced to efficiently cause the phase separation.

<Containment of Carrier>

Let's consider that the phase-separation spontaneously occurs in each of the red-light-emitting dopant 105, green-light-emitting dopant 106 and blue-light-emitting dopant 107 to form the pseudo laminated structure, illustrated in FIG. 1. The green-light-emitting, blue-light-emitting and red-light-emitting dopants are arranged in this order from the anode in consideration of the carrier conduction, determined by the highest occupied molecular orbital (HOMO) energy and lowest unoccupied molecular orbital (LUMO) energy of each of the dopants. The HOMO energy is determined by photoemission spectroscopy, whereas the LUMO energy may be determined by finding the HOMO-LUMO differential energy from the absorption spectra or directly by inverse photoemission spectroscopy. When the host material has a large HOMO-LUMO energy differential, and each of the dopants has the HOMO and LUMO energies in the differential range and is present at an adequate concentration, the carrier conduction proceeds by hopping over the level of each of the dopants. When the absolute value of the LUMO energy of the blue-light-emitting dopant 107 is sufficiently higher than that of the green-light-emitting dopant 106, the electrons propagating over the LUMO of the blue-light-emitting dopant 107 hop to the LUMO of the green-light-emitting dopant 106 at a reduced probability, and mostly contained in the blue-light-emitting dopant 107. When the differential between the HOMO energy of the blue-light-emitting dopant 107 and that of the green-light-emitting dopant 106 is relatively small, the holes propagating over the HOMO of the green-light-emitting dopant 106 can hop to the HOMO of the blue-light-emitting dopant 107, with the result that recombination of the carriers (electrons or holes) occurs on the blue-light-emitting dopant 107, to directly emit blue light, or the excitation energy transfers toward the green-light-emitting dopante 106 to emit green light. On the other hand, the holes can be contained between the red-light-emitting dopant 105 and electron injection layer 109, to emit red light by the recombination of the injected electron. The red light emission can also occur when the excitation energy transfers from the blue-light-emitting dopant 106 or green-light-emitting dopant 107.

As discussed above, the present invention contains the carrier in the vicinity of each of the dopants, thus improving emission efficiency of each light of color and hence realizing a white-light-emitting device of high efficiency.

Next, the other components are described. As discussed earlier, the hole injection layer 101, hole transport layer 102, electron transport layer 108 or electron injection layer 109 are not necessarily needed.

Examples of the preferable material for the hole injection layer 101 include electroconductive polymers, e.g., poly(3,4-ethylenedioxythiophene), PEDOT, and polystyrene-sulfonate, PSS. Polypyrrole-base and tirphenylamine-base polymers are also useful. They may be used in combination of low-molecular-weight material. Phthalocyanine-base and starburst-amine-base compounds are also applicable.

Examples of the material for the hole transport layer 102 include, but not limited to, starburst-amine-base compound, stilbene derivative, hydrazone derivative and thiophene derivative. They may be used in combination.

The electron transport layer 108 is responsible for donating electrons to the light-emitting layer 103. Examples of the material for the electron transport layer 108 include bis(2-methyl-8-quinolinolate)-4-(phenylphenolate) aluminium (Balq), tris(8-quinolinolate)aluminum (Alq3), oxadiazole derivative, triazole derivative, fllerene derivative, phenanthroline derivative and quinoline derivative.

The electron injection layer 109 works to improve efficiency of injection of the electrons from the cathode to the electron transport layer 108. Examples of the preferable material for the electron injection layer 109 include, but not limited to, lithium fluoride, magnesium fluoride, calcium fluoride, strontium fluoride, barium fluoride, magnesium oxide and aluminum oxide. They may be used in combination.

The material for the anode as the lower electrode 111 is not limited so long as it is transparent and having a high work function. The examples include an electroconductive oxide, e.g., ITO or IZO, or metal of high work function, e.g., thin Ag. The electrode can be patterned normally on a substrate, e.g., glass, by photolithography.

The cathode as the upper electrode 112 works to reflect light emitted from the light-emitting layer 103. Examples of the material for the upper electrode 112 include, but not limited to, LiF/Al laminate and Mg/Ag alloy. LiF may be replaced by a Cs, Ba or Ca compound.

The coating solution of the present invention is composed of a host material, and red-light-emitting, green-light-emitting and blue-light-emitting dopants dissolved in an adequate solvent. The coating solution may not necessarily need a green-light-emitting dopant. The solvents useful for the present invention are not limited so long as they can dissolve these components. The examples include aromatic hydrocarbons (e.g., toluene), ethers (e.g., tetrahydrofuran), alcohols, fluorine-base ones. These solvents may be used in combination for adjusting solubility and drying speed of each component. For example, a mixture of solvents of different boiling point may be used, wherein the higher-boiling one is used as a poor solvent with the red-light-emitting dopant to accelerate transfer of the dopant to the film surface. Solubility of the solvent is determined by liquid chromatography.

The coating methods for forming the light-emitting layer include spin coating, casting, dip coating, spray coating, screen printing and ink-jet printing, one of which is selected to form the light-emitting layer.

The device structure is described taking a bottom emission type structure as an example. However, the present invention is also applicable to a top emission type structure with the upper electrode working as a transparent electrode so long as the upper and lower electrodes work as the respective cathode and anode.

The present invention is described in more detail by specific examples. It should be understood that these examples are intended to illustrate some aspects of the present invention and not to limit the invention. Those skilled in the art can make various variations and modifications without departing from the scope of the technical concept of the invention described herein.

EXAMPLES

Example 1

<Synthesis of Exemplary Compound 1>

First, the red-light-emitting dopant represented by the structural formula (1) was synthesized as one of the major constituents of the present invention to produce the white-light-emitting device of the present invention.

The compound represented by Formula 6 was synthesized as the essential intermediate for synthesizing the compounds represented by Formulae 2 and 3 by the following procedure.

[Formula 6]

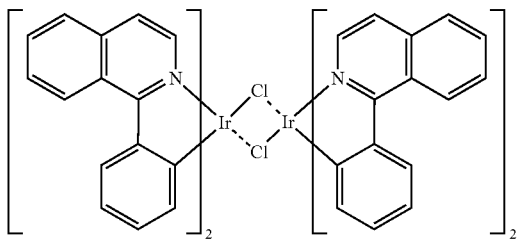

(Formula 6)

A 200 mL three-necked flask was charged with 0.718 g of phenylisoquinoline dissolved in 30 mL of ethoxyethanol and 0.418 g of iridium chloride dissolved in 10 mL of water, which were mixed with each other in the flask. The mixture was heated at 120° C. for 10 hours under reflux in a nitrogen atmosphere, then cooled to room temperature, and treated by evaporation. The resulting solid was washed with alcohol to produce the compound represented by Formula 6.

(Synthesis of Compound Represented by Formula 2)

The compound represented by Formula 2 was synthesized by the following procedure.

A 200 mL three-necked flask was charged with 0.959 g of the intermediate A, 0.512 g of 2,2-dimethyl-6,6,7,7,8,8,8-heptafluoro-3,5-octanedione, 0.25 g of sodium carbonate and 30 mL of ethoxyethanol. The mixture was heated at 115° C. for 10 hours under reflux in a nitrogen atmosphere, then cooled to room temperature, and treated by evaporation. The resulting solid was washed with water and hexane, and treated by silica-gel column chromatography with a mixed solvent of ethyl acetate and hexane as the mobile phase to produce the compound represented by Formula 2. It had a molecular weight of 897, determined by mass analysis.

The compound represented by Formula 2 was dissolved in dichloromethane and analyzed by fluorescent spectroscopy. It emitted red light having a peak wavelength of 617 nm.

A mixed film of the compound represented by Formula 2 and mCP as the host material was formed on a quartz substrate by spin coating, with THF as a solvent used to keep the solid concentration at 1% by mass and exemplary compound concentration at 10% by mass based on mCP. The coating film was measured for contact angle with water, which can be determined by θ/2 method, tangential or curve-fitting method. It was 92.1°. The films of individual mCP and the compound represented by Formula 2 as the reference samples had the contact angles of respective 80.6 and 96.7°. It was considered that the compound represented by Formula 2 was not uniformly dispersed in mCP but distributed more in the surface area because of the angle greatly changing with the mixing ratio.

(Synthesis of Compound Represented by Formula 3)

The compound represented by Formula 3 was synthesized by the following procedure.

A 200 mL three-necked flask was charged with 0.959 g of the compound represented by Formula 6, 0.706 g of 1,1,1,2,2,3,3,7,7,8,8,9,9,9-tetradecafluoro-4,6-nonandione, 0.25 g of sodium carbonate and 30 mL of butoxyethanol. The mixture was heated at 150° C. for 20 hours under reflux in a nitrogen atmosphere, then cooled to room temperature, and treated by evaporation. The resulting solid was dissolved in dichloromethane and filtered. The filtrate was separated and washed with dichloromethane/water. The dichloromethane solution was removed and treated by evaporation. The resulting solid was washed with hexane and treated by alumina column gas chromatography with dichloromethane as the mobile phase to produce the compound represented by Formula 3.

<Preparation of Organic Light-Emitting Device>

Example 1 prepared the white-light-emitting device having a structure illustrated in FIG. 2, with the lower electrode of ITO and hole injection layer of PEDOT, formed by spin coating, and hole transport layer of a polymer. The organic light emitting layer was composed of mCP (1,3-bis(carbazol-9-yl)benzene) as the host material, iridium complex (bis(3,5-difluoro-2-(2-pyridyl)phenyl-(2-carboxypyridyl)iridium (III)) as the blue-light-emitting dopant and the compound represented by Formula 2, prepared above, as the red-light-emitting dopant in a weight ratio of 100/5/1.

The host material, blue-light-emitting dopant and red-light-emitting dopant were dissolved in THF to keep the solid concentration at 1% by mass and red-light-emitting dopant at 0.46% by mol based on the solid component, determined by liquid chromatography. The solution was used to form the organic light-emitting layer by spin coating. Then, the electron transport layer of BAlq and Alq3 was formed by vacuum vapor deposition, and then the upper electrode of LiF/Al laminate was formed, to prepare the target organic light-emitting device.

A voltage was applied to the organic light-emitting device thus prepared to confirm that each of the red-light-emitting and blue-light-emitting dopants emitted light, as evidenced by the EL spectral pattern, and that the device emitted white light. The device was also prepared in the same manner except that the red-light-emitting dopant contained no fluoroalkyl group for comparison. The device was confirmed to emit blue light of decreased intensity and red light of increased intensity.

Example 2

Example 2 prepared the light-emitting layer in the same manner as in Example 1, except that mCP was used for the host material, bis(3,5-difluoro-2-(2-pyridyl)phenyl-(2-carboxypyridyl)iridium (III) was used for the blue-light-emitting dopant, the compound represented by Formula 2 was used for the red-light-emitting dopant, and the compound represented by Formula 5 or Ir(ppy)3 dissolved in THF was used for the green-light-emitting dopant.

[Formula 5]

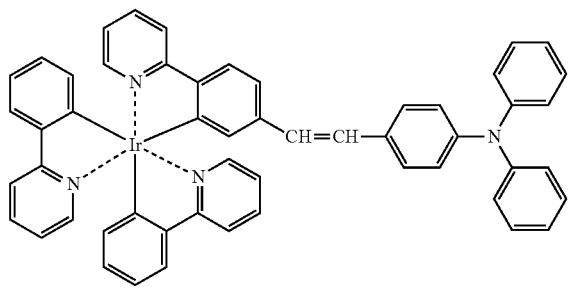

(Formula 5)

A voltage was applied to the organic white-light-emitting device with the green-light-emitting dopant of the compound represented by Formula 5 to confirm that each of the red-light-emitting dopant, green-light-emitting and blue-light-emitting dopants emitted light. For the device with the green-light-emitting dopant of Ir(ppy)3, the blue-light-emitting and green-light-emitting dopants emitted light of lower intensity than the red-light-emitting dopant.

Example 3

Figure 3:
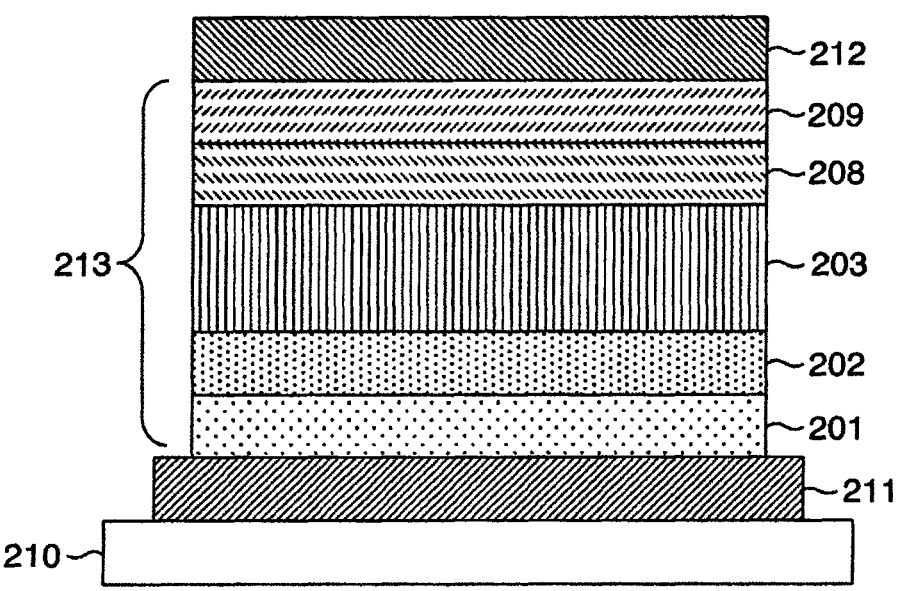
FIG. 3 is a cross-sectional view of one embodiment of the white-light-emitting device of the present invention.

FIG. 3 is a cross-sectional view of the organic white-light-emitting device prepared in Example 3. The device had an upper electrode 212 as the first electrode, lower electrode 211 as the second electrode and organic layer 213. The lower electrode 211 and upper electrode 212 may be used as the respective first and second electrodes. The device illustrated in FIG. 3 comprised a substrate 210 which supported the lower electrode 211, organic layer 213 and upper electrode 212 in this order from the substrate. It was of bottom emission type in which light emitted by a light-emitting layer 203 was taken out from the lower electrode 211 side. The lower electrode 211 was the transparent electrode working as the anode and upper electrode 212 was the repeller working as the cathode. The organic layer 213 was composed of a hole injection layer 210, hole transport layer 202, light-emitting layer 203, electron transport layer 208 and electron injection layer 209. The organic layer 213 may not necessarily have the above structure. It may be of a single-layer structure with the light-emitting layer 203 alone or multi-layer structure having no hole transport layer 202. Moreover, the electron transport layer 208 may be a laminate of the electron transport layer and blocking layer. The organic light-emitting layer illustrated in FIG. 3 makes a light source device, when provided with a driving circuit, case and so on.

The light-emitting layer 203 had a host material, and red-light-emitting dopant 205, green-light-emitting dopant 206 and blue-light-emitting dopant 207. The green-light-emitting dopant 206 may not be necessary so long as the layer 203 emit white light. Each of the red-light-emitting dopant 205 and blue-light-emitting dopant 207 were localized in the light-emitting layer 203 to form a pseudo laminated structure. First, the light-emitting layer structure is described.

An iridium complex represented by Formula 1' was used for the red-light-emitting dopant.

[Formula 1']

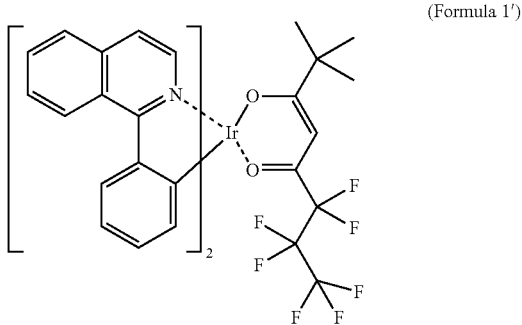

(Formula 1')

Another useful iridium complex is represented by Formula 2'.

[Formula 2']

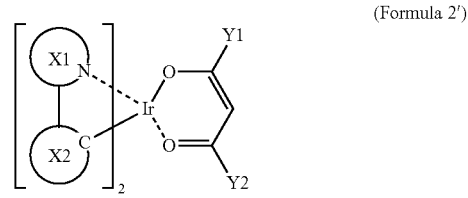

(Formula 2')

In Formula 2', X1 is an N-containing aromatic hetero ring, and X2 is an aromatic hydrocarbon ring or aromatic hetero ring. Examples of the aromatic hetero ring represented by X1 include quinoline, isoquinoline, pyridine, quinoxaline, thiazole, pyrimidine, benzothiazole, oxazole, benzoxazole, indole and isoindole rings. Examples of the aromatic hydrocarbon ring or aromatic hetero ring represented by X2 include benzene, naphthalene, anthracene, thiophene, benzothiophene, furan, benzofuran and fluorene rings. Examples of Y1 and Y2 include fluoroalkyl, perfluoroalkyl, alkyl (of 10 carbon atoms or more), perfluoropolyether and siloxy (Si—O—Si—) groups. The red-light-emitting dopant 205 may contain one or more of these functional groups. The functional group of Y1 or Y2 works to lower surface energy and hence to localize the red-light-emitting dopant in the surface on the upper electrode side in the light-emitting layer.

The functional group may be introduced to the major skeleton directly, as illustrated by Formula 2', or indirectly via an amido or ester bond, to distribute red-light-emitting dopant in the light-emitting layer at graded concentrations.

Other compounds having a similar functional group may be used. These include so-called phosphorescent dopants, e.g., osmium complex, europium complex and platinum complex, and (E)-2-(2-4-(dimethylamino)styryl)-6-methyl-4H-pyran-4-ylidene)malononitrile (DCM).

Examples of the material for the host material 204 in the light-emitting layer 203 include mCP (1,3-bis(carbazol-9-yl)benzene). The other materials include carbazole, fluorine and arylsilane derivatives. The host material 204 preferably has a sufficiently higher excitation energy than the blue-light-emitting dopant, in order to efficiently emit light. Excitation energy is determined by emission spectroscopy.

The host material may be a mixture of a plurality species of host materials. Part of the host material 204 may be substituted with fluoroalkyl, perfluoroalkyl, alkyl (of 10 carbon atoms or more), perfluoropolyether or siloxy (—Si—O—Si—) group. Such a material, when incorporated in the host material 204, facilitates localization of part of the host material in the light-emitting layer 203 surface, with the result that it is present in the surface together with the red-light-emitting dopant to prevent agglomeration of the dopant and thereby to improve light-emitting efficiency.

This example used an iridium complex represented by Formula 3' for the green-light-emitting dopant.

[Formula 3']

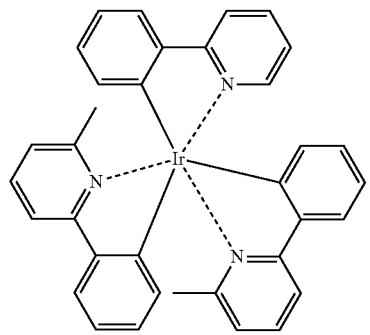

(Formula 3')

An iridium complex having 2 species of different ligands, represented by Formula 4' may be used instead of a coumarin compound or the above iridium complex having almost similar ligands.

[Formula 4']

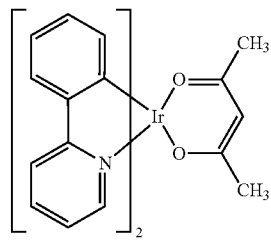

(Formula 4')

The green-light-emitting dopant does not need a special functional group. It is however preferably low in symmetry viewed from improving solubility. It may have a substituent low in compatibility with the underlying layer, such as the hole transport layer, hole injection layer or lower electrode.

This example used an iridium complex represented by Formula 5' having a substituent for the blue-light-emitting dopant for transferring the dopant toward the underlying layer.

[Formula 5']

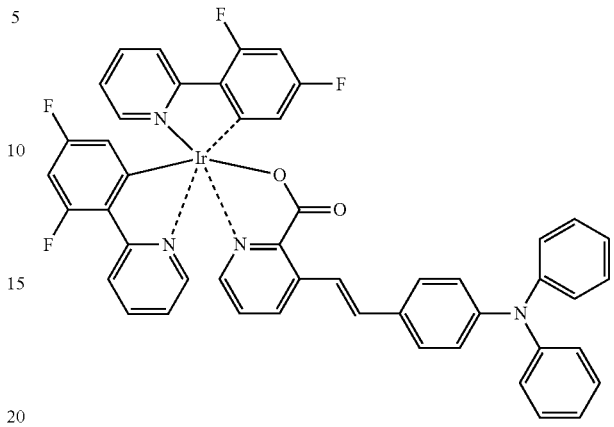

(Formula 5')

The functional group varies depending on the underlying layer to which the dopant is transferred during the film-making step. When the underlying layer is the hole transport layer, the group should have a structure similar to the hole transport layer, e.g., arylamino or carbazole group, or hydrazone site. When the underlying layer is of ITO or a metal, examples of the functional group include hydroxyl (—OH), thiol (—SH), carboxyl (—COOH), sulfo (—SO$_3$H) or bipyridyl group, or I, Br, Cl, F, SCN, CN, NH$_2$ or NO$_2$. The green-light-emitting dopant 207 may contain one or more of these functional groups. Hydroxyl is preferable, when the light-emitting layer is incorporated with an oxide of high specific gravity. A long-chain alkyl group is preferable, when the underlying layer has a long-chain alkyl group. The group may be introduced to the major skeleton directly, as illustrated by Formula 5', or indirectly via an alkyl chain in consideration of the molecular size. A perylene derivative is also a useful material for the blue-light-emitting dopant 207.

Next, the other components are described. As discussed earlier, the organic layer 213 may not necessarily need the hole injection layer 201, hole transport layer 202, electron transport layer 208 or electron injection layer 209.

This example used poly(3,4-ethylenedioxythiophene (PEDOT) and polystyrenesulfonate (PSS) for the hole injection layer 201. Polyaniline-base, polypyrrole-base and triphenylamine-base polymers are also useful. A material incorporated with fine metal particles is also useful. They may be used in combination of low-molecular-weight material. A phthalocyanine-base compound is also applicable.

This example used an arylamine-base polymer for the hole transport layer 202. Other materials useful for the hole transport layer 202 include, but not limited to, polyfluorene-base, polyparaphenylene-base, polyarylene-base and polycarbazole-base polymers, and starburst-amine-base compound, stilbene derivative, hydrazone derivative and thiophene derivative. They may be used in combination.

The electron transport layer 208 was responsible for donating electrons to the light-emitting layer 203. This example used bis(2-methyl-8-quinolinolate)-4-(phenylphenolate) aluminium (Balq) and tris(8-quinolinolate) aluminum (Alq3), which formed a laminated structure, for the electron transport layer 208. This layer may be of a single-layer structure of Balq, Alq3, oxadiazole derivative, fllerene derivative, quinoline derivative or silole derivative.

The electron injection layer 209 worked to improve efficiency of injection of the electrons from the cathode to the electron transport layer 208. This example used lithium fluoride for the layer 209. Other useful materials include, but not limited to, magnesium fluoride, calcium fluoride, strontium fluoride, barium fluoride, magnesium oxide and aluminum oxide. A mixture of electron-transferring material and alkali metal or alkali metal oxide, or mixture of electron-transferring material and electron-donating material may be used. They may be used in combination.

This example used ITO for the lower electrode 211. The material for the anode as the lower electrode 211 is not limited so long as it is transparent and having a high work function. The examples of the material include an electroconductive oxide, e.g., ITO or IZO, or metal of high work function, e.g., thin Ag. The electrode can be patterned normally on a substrate, e.g., glass, by photolithography.

This example used Al for the upper electrode 212. The cathode as the upper electrode 212 injected the electrons into the light-emitting layer 203 to reflect light emitted from the light-emitting layer. Examples of the suitable material for the upper electrode 212 specifically include Al, Mg/Ag alloy and Ag.

The coating solution was composed of the host material 204, red-light-emitting dopant 205, green-light-emitting dopant 206 and blue-light-emitting dopant 207, dissolved in an adequate solvent. The coating solution may not necessarily need the green-light-emitting dopant 206. The solution contained the host material 204, red-light-emitting dopant 205, green-light-emitting dopant 206 and blue-light-emitting dopant 207 in a ratio of 100/1/5/1 by mass. In terms of the concentration based on the solid component, the red-light-emitting dopant 205, green-light-emitting dopant 206 and blue-light-emitting dopant 207 were present at 0.46, 2.9 and 0.5% by mol, respectively. This example used tetrahydrofuran (THF) as the solvent. The solvents useful for the present invention are not limited so long as they can dissolve these components. The examples include aromatic hydrocarbons (e.g., toluene), ethers (e.g., tetrahydrofuran), alcohols, fluorine-base ones. These solvents may be used in combination for adjusting solubility and drying speed of each component. For example, a mixture of solvents of different boiling point may be used, wherein the higher-boiling one is used as a poor solvent with the red-light-emitting dopant 205 to accelerate transfer of the dopant to the film surface. Solubility of the solvent is determined by liquid chromatography.

This example used spin coating for forming the light-emitting layer. The other useful methods include casting, dip coating, spray coating, screen printing and ink-jet printing.

The device structure is described taking a bottom emission type structure as an example. However, the present invention is also applicable to a top emission type structure with the upper electrode working as a transparent electrode so long as the upper and lower electrodes work as the respective cathode and anode.

Figure 4:
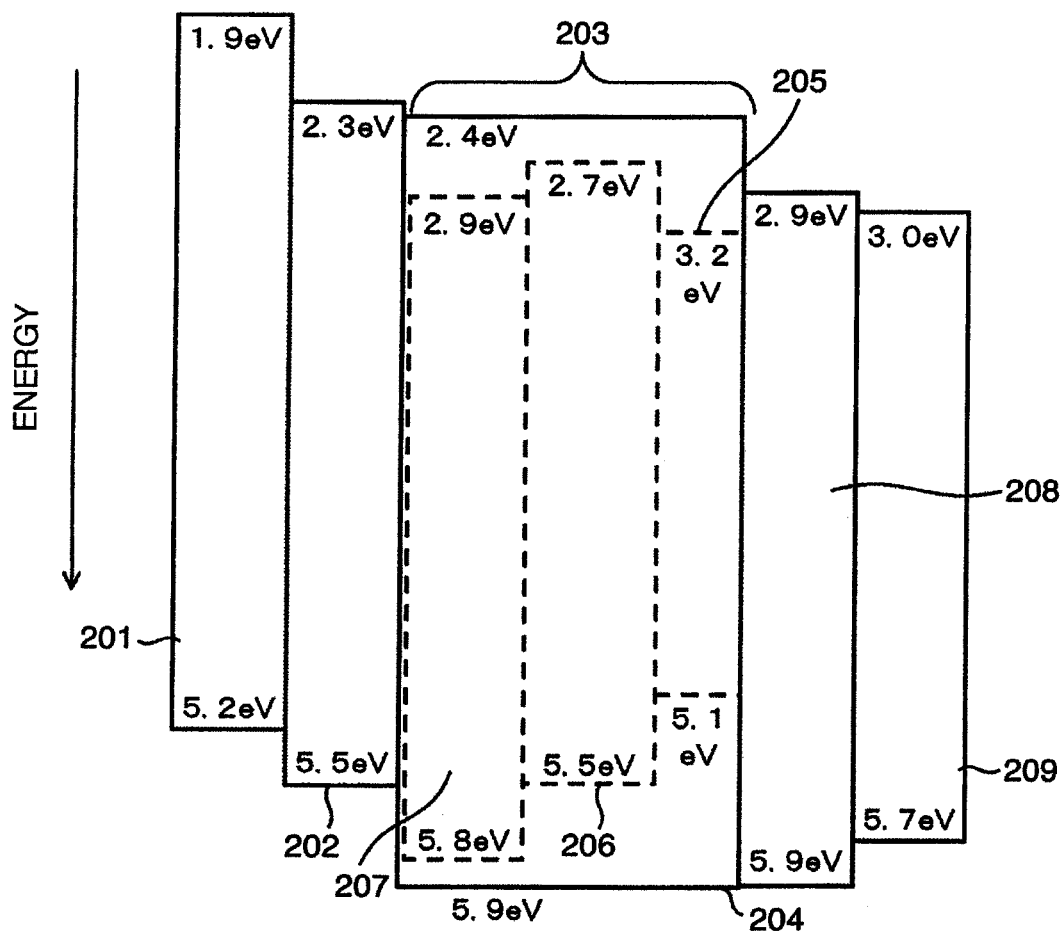
FIG. 4 is an energy diagram of the white-light-emitting device prepared in Example 1.

A voltage was applied to the light-emitting device prepared in this example, positive at the lower electrode and negative at the upper electrode, to confirm that the device emitted white light comprising blue, green and red lights. FIG. 4 illustrates the energy diagram of the device.

The device has the energy diagram illustrated in FIG. 4, when each of the red-light-emitting dopant 205 and blue-light-emitting dopant 207 has spontaneous phase-separation. FIG. 4 shows that the lowest unoccupied molecular orbital (LUMO) energy of the blue-light-emitting dopant 207 is intermediate between those of the light-emitting layer 203 and second electrode 211, and lower than that of the layer adjacent to the light-emitting layer 203. The lowest unoccupied molecular orbital (LUMO) energy is determined by finding the HOMO (highest occupied molecular orbital)-LUMO differential energy from the absorption spectra or directly by inverse photoemission spectroscopy. In this case, the electron is injected from the electron transport layer 208 into the light-emitting layer 203, and trapped by the blue-light-emitting dopant 207. On the other hand, the hole is injected from the hole transport layer 202 into the blue-light-emitting dopant 207, where the electron and hole are recombined with each other to emit light. Part of the hole is transferred toward the green-light-emitting dopant 206 and red-light-emitting dopant 205, where it is recombined with the electron injected from the electron transport layer 208 to emit light. Thus, the device efficiently emits light, because of the presence of energy barrier which blocks flow of the electron between the hole transport layer 202 and blue-light-emitting dopant 207.

Comparative Example 1

Comparative Example 1 prepared a light-emitting device in the same manner as in Example 3, except that a compound represented by Formula 6' was used for the red-light-emitting dopant 205 and compound represented by Formula 7' for the blue-light-emitting dopant 207. The device emitted light of high intensity only from the red-light-emitting dopant 205, with the blue-light-emitting dopant 207 and green-light-emitting dopant 206 emitting light of low intensity, conceivably because the green-light-emitting dopant 206 and red-light-emitting dopant 205 were close enough to the blue-light-emitting dopant 207 to cause transfer of energy from the blue-light-emitting dopant 207 and green-light-emitting dopant 206 to the red-light-emitting dopant 205.

[Formula 6']

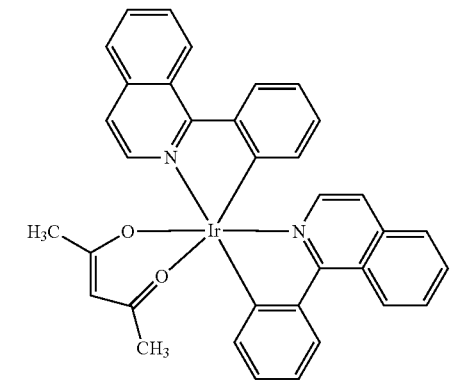

(Formula 6')

[Formula 7']

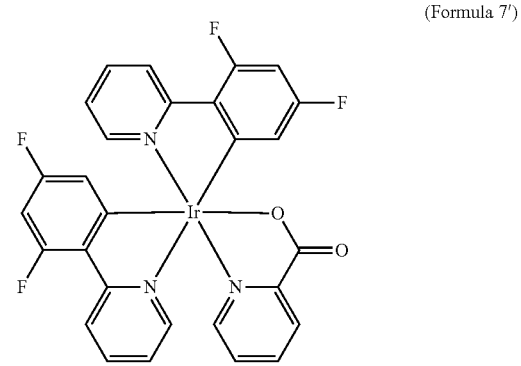

(Formula 7')

Example 4

Example 4 prepared a light-emitting device in the same manner as in Example 3, except that the compound represented by Formula 7' was used for the blue-light-emitting dopant 207 for the light-emitting layer and the coating solution contained the host material 204, red-light-emitting dopant 205, green-light-emitting dopant 206 and blue-light-emitting dopant 207 in a ratio of 100/1/0.5/1 by mass. The red-light-emitting dopant 205, green-light-emitting dopant 206 and blue-light-emitting dopant 207 were present at 0.45, 0.28 and 5.5% by mol, respectively. The device emitted white light comprising blue, green and red lights.

Comparative Example 2

Comparative Example 2 prepared a light-emitting device in the same manner as in Example 4, except that the compound represented by Formula 6' was used for the red-light-emitting dopant 205. The device emitted light of high intensity only from the red-light-emitting dopant 205, with the blue-light-emitting dopant 207 and green-light-emitting dopant 206 emitting light of low intensity.

Example 5

Example 5 prepared a light-emitting device in the same manner as in Example 3, except that a compound represented by Formula 8' was used in addition to mCP for the host material 204 for the light-emitting layer.

[Formula 8']

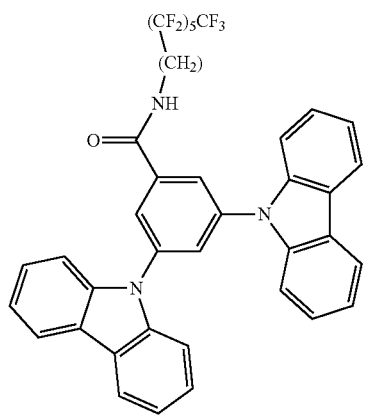

(Formula 8')

The device emitted light more efficiently than that prepared in Example 3.

Example 6

Example 6 prepared a light-emitting device in the same manner as in Example 4, except that a compound represented by Formula 8' was used in addition to mCP for the host material 204 for the light-emitting layer.

[Formula 8']

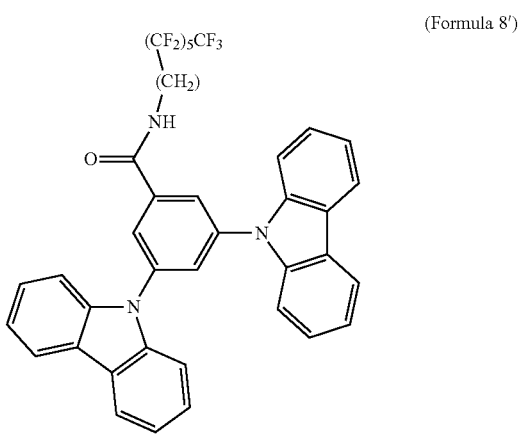

(Formula 8')

The device emitted light more efficiently than that prepared in Example 4.

Example 7

Example 7 prepared a light-emitting device in the same manner as in Example 3, except that a compound represented by Formula 9' was used for the red-light-emitting dopant 205 for the light-emitting layer. The device emitted white light comprising blue, green and red lights.

[Formula 9']

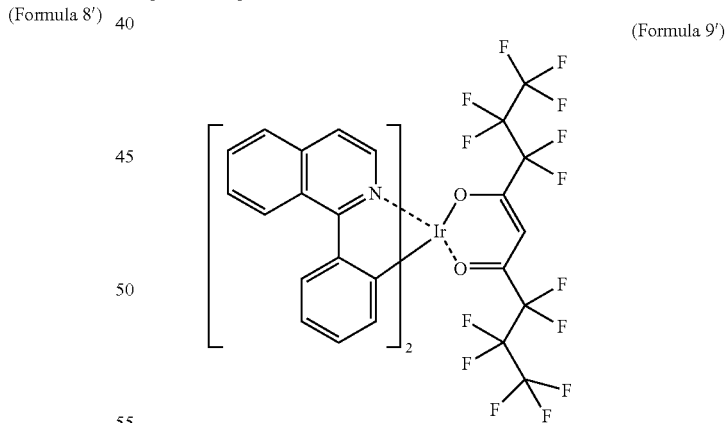

(Formula 9')

Example 8

Example 8 prepared a light-emitting device in the same manner as in Example 3, except that a compound represented by Formula 10' was used for the blue-light-emitting dopant 207 for the light-emitting layer, and the light-emitting layer contained fine titania particles having a diameter of about 2 nm.

[Formula 10']

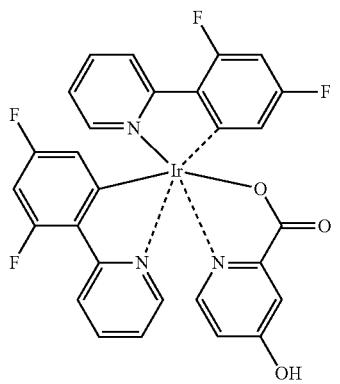

(Formula 10')

The device emitted white light comprising blue, green and red lights.

It should be further understood by those skilled in the art that although the foregoing description has been made on embodiments of the invention, the invention is not limited thereto and various changes and modifications may be made without departing from the spirit of the invention and the scope of the appended claims.

| Description of Reference Numerals | |
|---|---|
| 101 | Hole injection layer |
| 102 | Hole transport layer |
| 103 | Light-emitting layer |
| 104 | Host material |
| 105 | Red-light-emitting dopant |
| 106 | Green-light-emitting dopant |
| 107 | Blue-light-emitting dopant |
| 108 | Electron transport layer |
| 109 | Electron injection layer |
| 110 | Substrate |
| 111 | Lower electrode |
| 112 | Upper electrode |
| 113 | Organic layer |
| 201 | Hole injection layer |
| 202 | Hole transport layer |
| 203 | Light-emitting layer |
| 204 | Host material |
| 205 | Red-light-emitting dopant |
| 206 | Green-light-emitting dopant |
| 207 | Blue-light-emitting dopant |
| 208 | Electron transport layer |
| 209 | Electron injection layer |
| 210 | Substrate |
| 211 | Lower electrode |
| 212 | Upper electrode |

The invention claimed is:

1. An organic light-emitting device comprising:
a first electrode;
a second electrode; and
a light-emitting layer positioned between the first electrode and the second electrode,
wherein the light-emitting layer contains a host material, a red-light-emitting dopant and a blue-light-emitting dopant, the red-light-emitting dopant has a first functional group for transferring the dopant toward the first electrode, and the host material has a higher excitation energy than the blue-light-emitting dopant.

2. The organic light-emitting device according to claim 1, wherein the first functional group is at least one species selected from the group consisting of fluoroalkyl, perfluoroalkyl, alkyl (of 10 carbon atoms or more), perfluoropolyether and siloxy groups.

3. The organic light-emitting device according to claim 1, wherein the red-light-emitting dopant is of the iridium complex represented by Formula 1

[Formula 1]

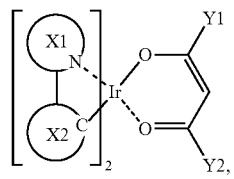

(Formula 1)

wherein X1 is an N-containing aromatic hetero ring, X2 is an aromatic hydrocarbon ring or aromatic hetero ring, and Y1 and Y2 are each fluoroalkyl, perfluoroalkyl, alkyl, perfluoropolyether or siloxy groups.

4. The organic light-emitting device according to claim 1, wherein the light-emitting layer contains a green-light-emitting dopant which has a second functional group for transferring the dopant to the second electrode.

5. The organic light-emitting device according to claim 4, wherein the second functional group is at least one species selected from the group consisting of hydroxyl (—OH), thiol (—SH), carboxyl (—COOH), sulfo (—$SO_3H$), I, Br, Cl, F, SCN, CN, $NH_2$, $NO_2$ and bipyridyl groups.

6. The organic light-emitting device according to claim 4, wherein a hole injection layer is disposed between the second electrode and the light-emitting layer, and
the second functional group is at least one species selected from the group consisting of phenylamino, oxazole and carbazole group, and hydrazone site.

7. The organic light-emitting device according to claim 4, wherein the absolute value of the lowest unoccupied molecular orbital energy of the blue-light-emitting dopant is higher than that of the green-light-emitting dopant.

8. The organic light-emitting device according to claim 1, wherein the light-emitting layer is prepared by a coating method.

9. A coating solution used for forming the light-emitting layer for the organic light-emitting device according to claim 1, containing a solvent, host material, red-light-emitting dopant and blue-light-emitting dopant.

10. A coating solution used for forming the light-emitting layer for the organic light-emitting device according to claim 4, containing a solvent, host material, red-light-emitting dopant, blue-light-emitting dopant and green-light-emitting dopant.

11. The coating solution according to claim 9, wherein the solvent contains first and second solvents, the first solvent boiling at a higher temperature than the second one, and working as a poor solvent with the red-light-emitting dopant.

12. A luminescent material used for forming the light-emitting layer for the organic light-emitting device according to claim 1, containing a host material, red-light-emitting dopant and blue-light-emitting dopant.

13. A luminescent material used for forming the light-emitting layer for the organic light-emitting device according to claim 4, containing a host material, red-light-emitting dopant, blue-light-emitting dopant and green-light-emitting dopant.

14. A light source device using the organic light-emitting device according claim 1.

15. An organic light-emitting device comprising:
a first electrode;
a second electrode; and
a light-emitting layer positioned between the first electrode and the second electrode,
wherein the light-emitting layer contains a host material, a red-light-emitting dopant and a green-light-emitting dopant, the red-light-emitting dopant is present in the light-emitting layer at graded concentrations, the red-light-emitting dopant has a first substituent to be localized in the vicinity of the first electrode, and the host material has a higher excitation energy than the blue-light-emitting dopant.

16. The organic light-emitting device according to claim 15, wherein the first substituent contains at least one species of functional group selected from the group consisting of fluoroalkyl, perfluoroalkyl, alkyl (of 10 carbon atoms or more), perfluoropolyether and siloxy groups.

17. The organic light-emitting device according to claim 15, wherein the red-light-emitting dopant is of the iridium complex represented by Formula 2'

[Formula 2']

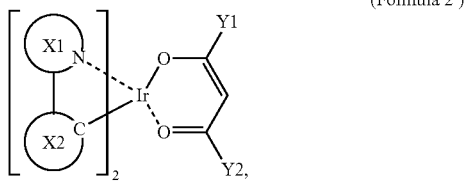

(Formula 2')

wherein X1 is an N-containing aromatic hetero ring, X2 is an aromatic hydrocarbon ring or aromatic hetero ring, and Y1 and Y2 are each fluoroalkyl, perfluoroalkyl, alkyl (of 10 carbon atoms or more), perfluoropolyether or siloxy (Si—O—Si—) group.

18. The organic light-emitting device according to claim 15, wherein the light-emitting layer contains a green-light-emitting dopant which contains a second substituent to be transferred to the second electrode.

19. The organic light-emitting device according to claim 18, wherein the second substituent contains at least one species of functional group selected from the group consisting of hydroxyl, thiol, carboxyl, sulfo, I, Br, Cl,F, SCN, CN, $NH_2$, $NO_2$ and bipyridyl groups.

20. The organic light-emitting device according to claim 18, wherein a hole transport layer is disposed between the second electrode and light-emitting layer, and the second substituent contains is at least one species of functional group selected from the group consisting of arylamino groups, carbazole groups, and hydrazone site.

21. The organic light-emitting device according to claim 15, wherein the host material contains the first substituent.

22. A coating solution used for forming the light-emitting layer for the organic light-emitting device according to claim 15, containing a solvent, host material, red-light-emitting dopant and green-light-emitting dopant.

23. A coating solution used for forming the light-emitting layer for the organic light-emitting device according to claim 18, containing a solvent, host material, red-light-emitting dopant, green-light-emitting dopant and blue-light-emitting dopant.

24. The organic light-emitting device according to claim 15, containing fine particles of metal oxide.

25. The organic light-emitting device according to claim 18, wherein the blue-light-emitting dopant has the lowest unoccupied molecular orbital energy intermediate between those of the light-emitting layer and second electrode, and lower than that of the layer adjacent to the light-emitting layer.

26. A luminescent material used for forming the light-emitting layer for the organic light-emitting device according to claim 15, containing a host material, red-light-emitting dopant and green-light-emitting dopant.

27. A luminescent material used for forming the light-emitting layer for the organic light-emitting device according to claim 18, containing a host material, red-light-emitting dopant, blue-light-emitting dopant and green-light-emitting dopant.

* * * * *

UNITED STATES PATENT AND TRADEMARK OFFICE
CERTIFICATE OF CORRECTION

| | | |
|---|---|---|
| PATENT NO. | : 8,729,536 B2 | Page 1 of 1 |
| APPLICATION NO. | : 13/659947 | |
| DATED | : May 20, 2014 | |
| INVENTOR(S) | : Hirotaka Sakuma et al. | |

It is certified that error appears in the above-identified patent and that said Letters Patent is hereby corrected as shown below:

On the title page item 71 Applicant:

"Hirotaka Sakuma, Hitachinaka (JP); Sukekazu Aratani, Hitachiota (JP); Hiroshi Sasaki, Mito (JP)"
should read -- Hitachi, Ltd., Tokyo (JP) --

Signed and Sealed this
Seventeenth Day of November, 2015

Michelle K. Lee
*Director of the United States Patent and Trademark Office*